(12) United States Patent
Ngo et al.

(10) Patent No.: US 6,650,145 B2
(45) Date of Patent: Nov. 18, 2003

(54) CIRCUITS AND SYSTEMS FOR LIMITED SWITCH DYNAMIC LOGIC

(75) Inventors: Hung Cai Ngo, Austin, TX (US); Wendy Ann Belluomini, Austin, TX (US); Robert Kevin Montoye, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/116,612

(22) Filed: Apr. 4, 2002

(65) Prior Publication Data

US 2003/0189445 A1 Oct. 9, 2003

(51) Int. Cl.[7] .................. H03K 19/00; H03K 19/20
(52) U.S. Cl. ............................ 326/98; 326/121
(58) Field of Search ..................... 326/93, 95–98, 326/112, 119, 121–122

(56) References Cited

U.S. PATENT DOCUMENTS 5,886,540 A * 3/1999 Perez .......................... 326/93
5,983,013 A * 11/1999 Rogers et al. ................ 702/79

OTHER PUBLICATIONS

Sigal et al., Circuit design techniques for the high–performance CMOS IBM S/390 Parallel Enterprise Server G4 microprocessor, IBM J. Res. Develop, vol. 41 No. 4/5, Jul./Sep. 1997, pp. 489–501.*

Durham–IBM, Figure—The 630FP Approach to Clocking and Latching, Domino Mid–Cycle Latch (DMCL), *ARL Clocking & Latch Workshop*, 03/18–20/97, p. 16.

Sigal et al., "Circuit design techniques for the high–performance CMOS IBM S/390 Parallel Enterprise Server G4 microprocessor," *IBM J. Res. Develop*, vol. 41, No. 4/5, Jul./Sep. 1997, pp. 489–501.

* cited by examiner

*Primary Examiner*—Michael Tokar
*Assistant Examiner*—James Cho
(74) *Attorney, Agent, or Firm*—Barry S. Newberger; Winstead Sechrest & Minick P.C.; Casimer K. Salys

(57) ABSTRACT

Circuits and systems for producing a static switching factor on the output lines of dynamic logic devices. A logic device having a dynamic portion and a static portion is implemented. In this way, an output logic state is maintained so long as the value of the Boolean operation being performed by the device does not change. Additionally, static logic elements may perform the inversions necessary to output both logic senses, mitigating the need to provide for dual-rail dynamic logic implementations. An asymmetric clock, permits a concomitant decrease in the size of the precharge transistors, thus ameliorating the area required by the logic element and, obviating a need for keeper device.

24 Claims, 5 Drawing Sheets

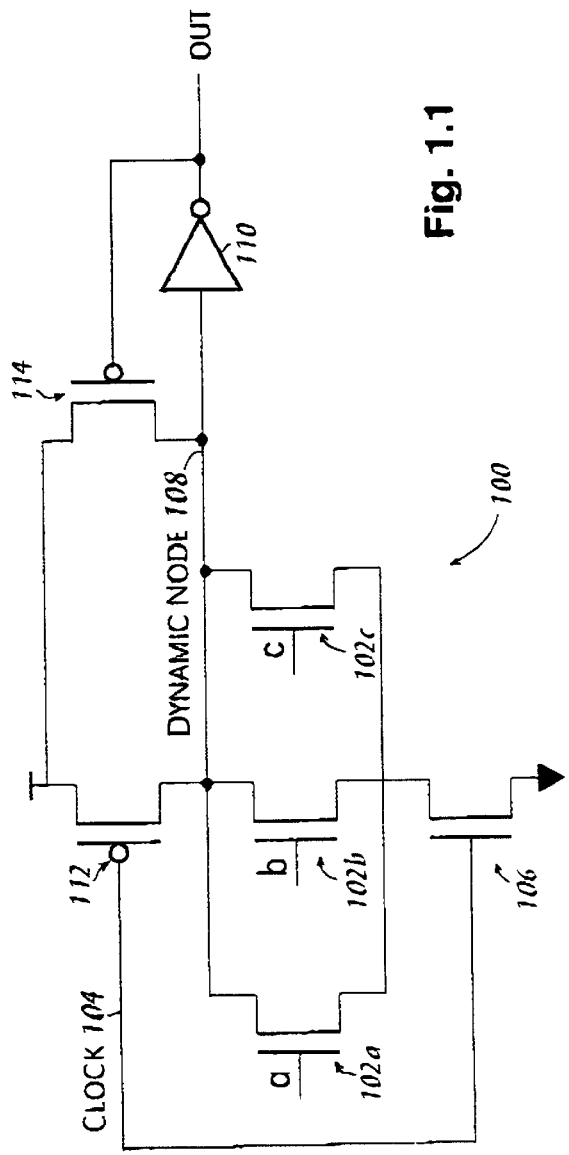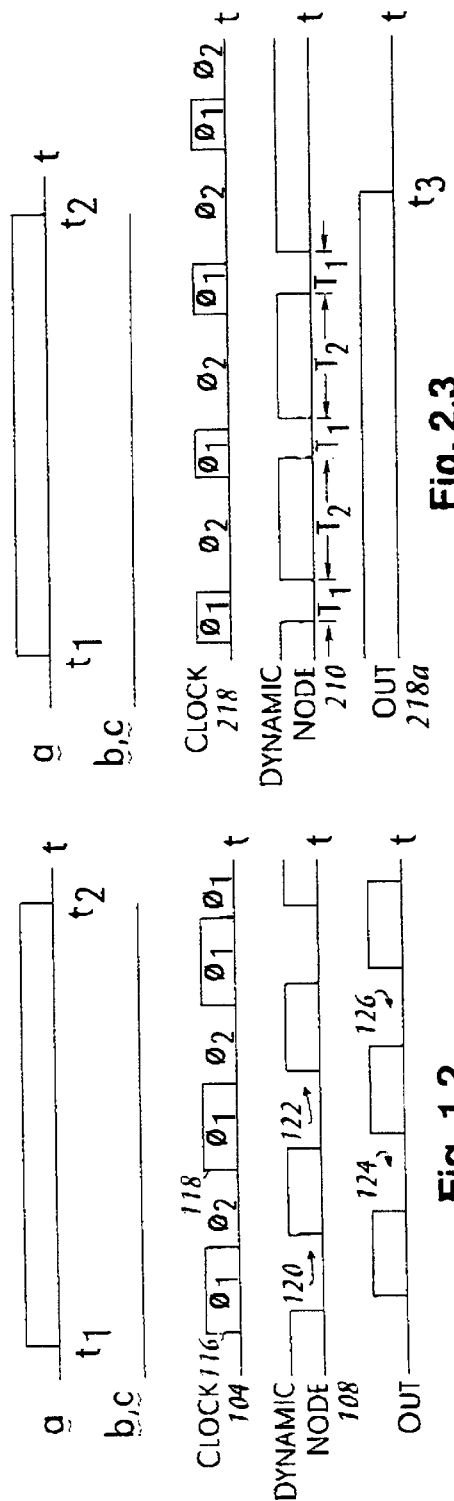

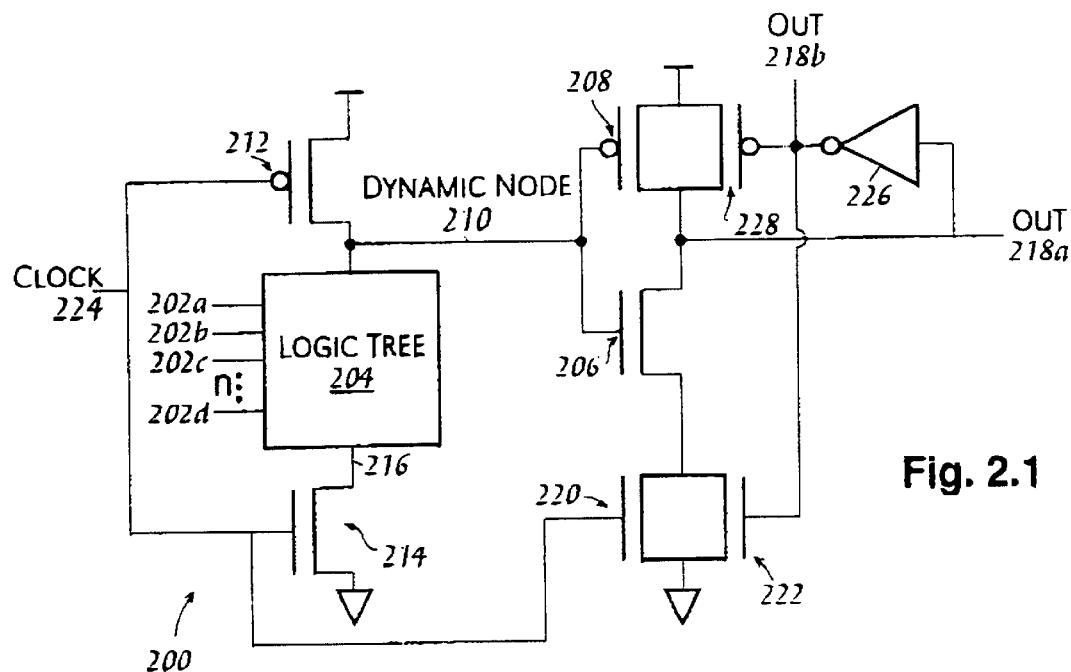
Fig. 2.1
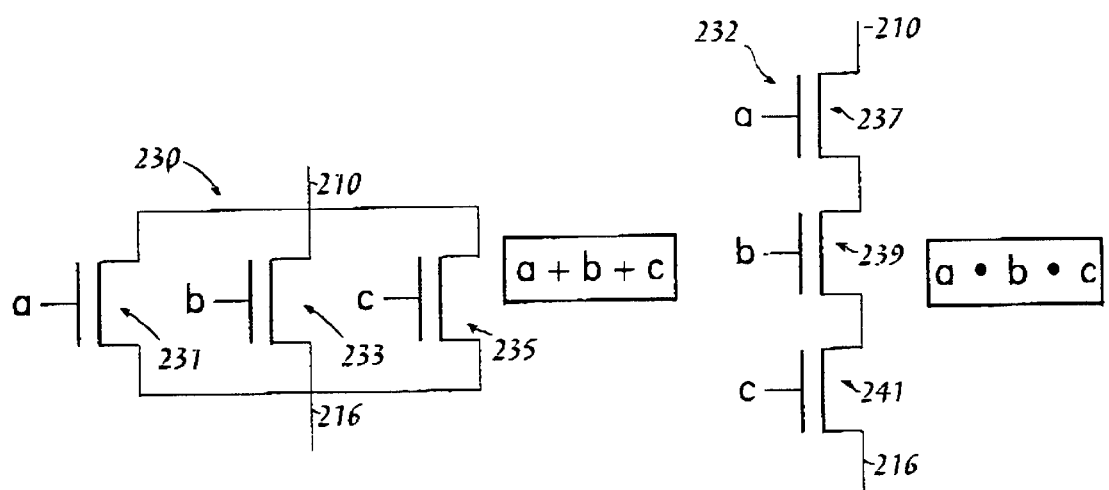
Fig. 2.2.1
Fig. 2.2.2

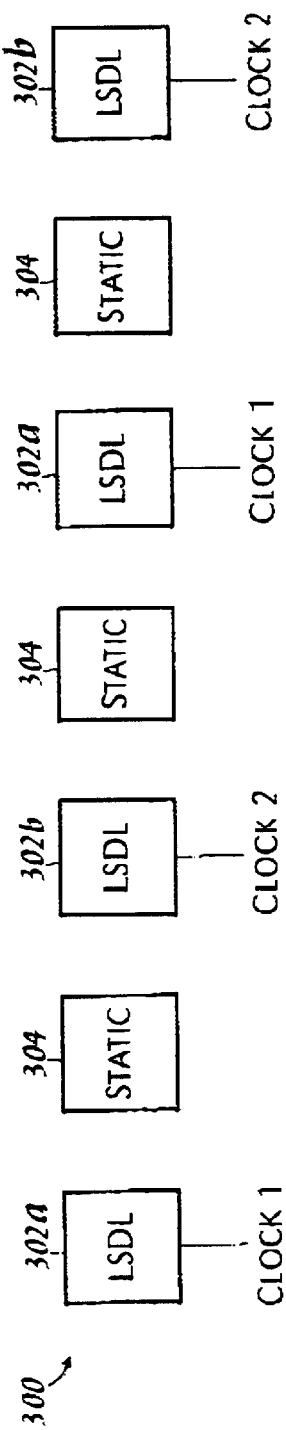
Fig. 3.1
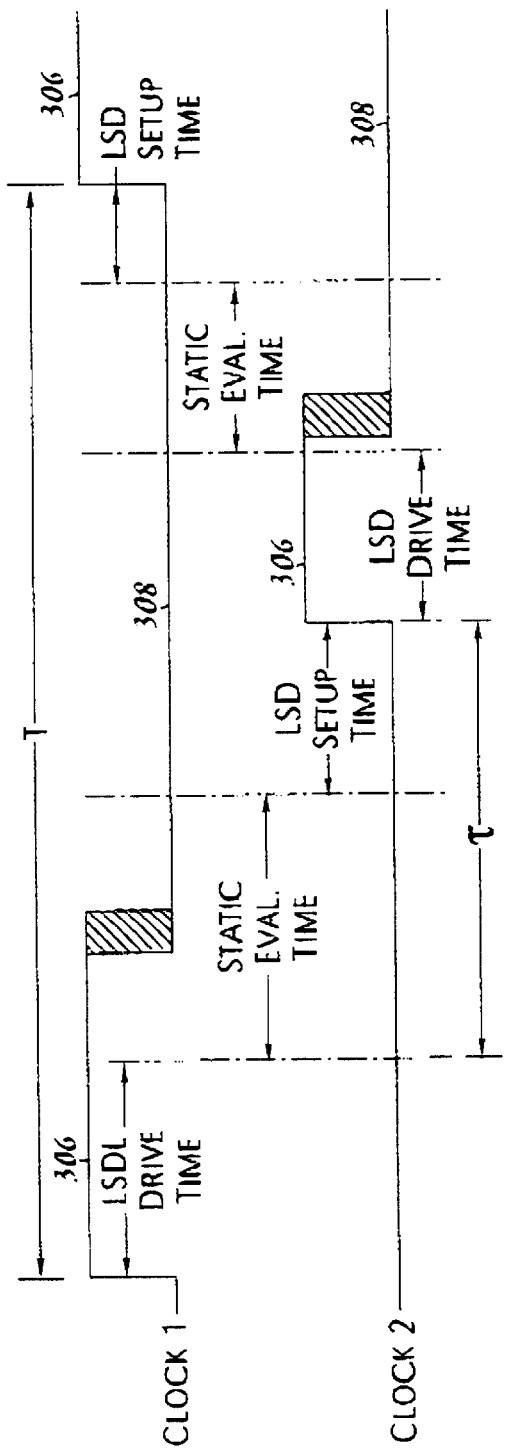
Fig. 3.2

US 6,650,145 B2

CIRCUITS AND SYSTEMS FOR LIMITED SWITCH DYNAMIC LOGIC

TECHNICAL FIELD

The present invention relates to dynamic logic circuits, and in particular, to dynamic logic circuits having a dynamic switching factor to reduce power consumption.

BACKGROUND INFORMATION

Modern data processing systems may perform Boolean operations on a set of signals using dynamic logic circuits. Dynamic logic circuits are clocked. During the pre-charge phase of the clock, the circuit is preconditioned, typically, by pre-charging an internal node of the circuit by coupling to a supply rail. During an evaluate phase of the clock, the Boolean finction being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock each cycle may consume power even when the logical value of the output is otherwise unchanged.

This may be a appreciated by referring to FIG. 1.1 illustrating an exemplary three-input OR dynamic logic gate, and the accompanying timing diagram, FIG. 1.2. Dynamic logic 100, FIG. 1.1, includes three inputs a, b and c coupled to a corresponding gate of NFETs 102a–102c. During an evaluate phase of clock 104, $\phi_1$ foot NFET 106 is active, and if any of inputs a, b or C is active, dynamic node 108 is pulled low, and the output goes "high" via inverter 110. Thus, referring to FIG. 1.2, which is illustrative, at $t_1$ input a goes high during a pre-charge phase $\phi_2$ of clock 104. (During the pre-charge phase $\phi_2$ of clock 104, dynamic node 108 is pre-charged via PFET 112. (Half-latch PFET 114 maintains the charge on dynamic node 108 through the evaluate phase, unless one or more of inputs a, b or c is asserted.) In the illustrative timing diagrams in FIG. 1.2, input a is "high" having a time interval $t_1$ through $t_2$ that spans approximately 2½ cycles of clock 104, which includes evaluation phases, 116 and 118. Consequently, dynamic node 108 undergoes two discharge-precharge cycles, 120 and 122. The output node similarly undergoes two discharge-precharge cycles, albeit with opposite phase, 124 and 126. Because the output is discharged during the pre-charge phase of dynamic node 108, even though the Boolean value of the logical function is "true" (that is, "high" in the embodiment of OR gate 100) the dynamic logic dissipates power even when the input signal states are unchanged.

Additionally, dynamic logic may be implemented in a dual rail embodiment in which all of the logic is duplicated, one gate for each sense of the data. That is, each logic element includes a gate to produce the output signal, and an additional gate to produce its complement. Such implementations may exacerbate the power dissipation in dynamic logic elements, as well as obviate the area advantages of dynamic logic embodiments.

Thus, there is a need in the art for circuits and systems which mitigate the dynamic switching factor of dynamic logic gates. Additionally, there is a further need for such circuits and systems that maintain the area advantage of dynamic logic over static circuits, and further provide both logic senses, that is, the output value and its complement.

BRIEF DESCRIPTION OF THE DRAWINGS

For a more complete understanding of the present invention, and the advantages thereof, reference is now made to the following descriptions taken in conjunction with the accompanying drawings, in which:

FIG. 1.1 illustrates, in partial schematic form, a dynamic logic gate which may be used in conjunction with the present invention;

FIG. 1.2 illustrates a timing diagram corresponding to the logic gate embodiment illustrated in FIG. 1.1;

FIG. 2.1 illustrates, in partial schematic form, a dynamic logic device in accordance with an embodiment of the present invention;

FIG. 2.2.1 illustrates, in partial schematic form, circuitry for incorporation in the dynamic logic device of FIG. 2.1 whereby the logic function performed is the logical OR of three input signals;

FIG. 2.2.2 illustrates, in partial schematic form, circuitry for incorporation in the dynamic logic device of FIG. 2.1 whereby the logic function performed is the logical AND of three input signals;

FIG. 2.3 illustrates a timing diagram corresponding to an embodiment of the dynamic logic device of FIG. 2.1 in which the logic finction performed is the logical OR of three input signals;

FIG. 3.1 illustrates, in block diagram form, a limited switch dynamic logic system in accordance with an embodiment of the present invention;

FIG. 3.2 illustrates a two-phase clock which may be used in conjunction with the logic system of FIG. 3.1;

SUMMARY OF THE INVENTION

Figure 4:
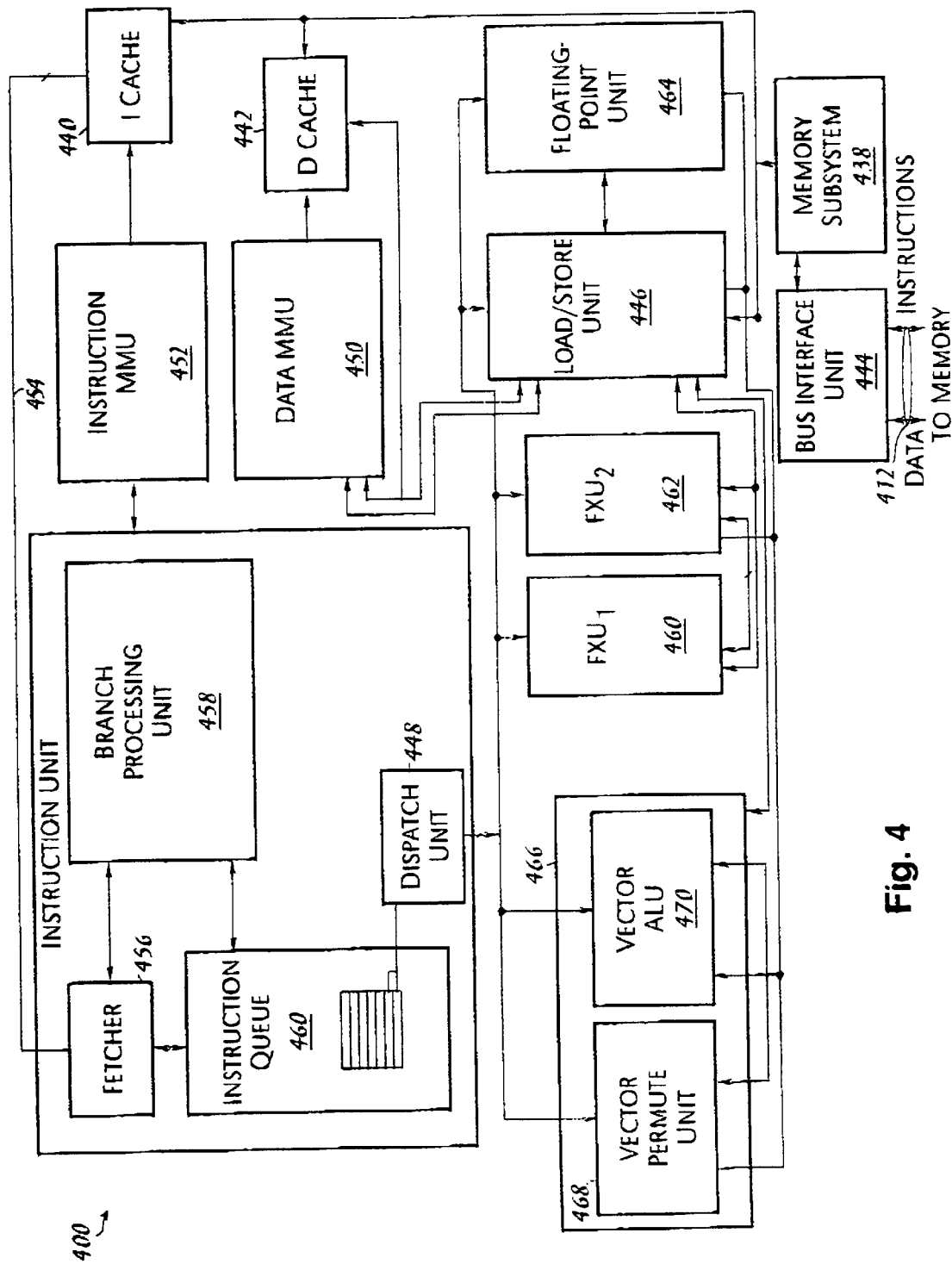
FIG. 4 illustrates a high level block diagram of selected operational blocks within a central processing unit (CPU) incorporating the present inventive principles.

The aforementioned needs are addressed by the present invention. Accordingly there are provided logic systems and circuits including a dynamic logic portion for evaluating a Boolean function of a plurality of input signals, in which a signal on a first node asserted in response to a first phase of a clock constitutes a first Boolean combination of the plurality of input signals. Also included is a static portion coupled to the first node. The static portion is configured to maintain a first output value of the logic device during a second phase of the clock; the first output value represents the Boolean function. Also a duration of the first phase of the clock is less than a duration of the second phase of the clock.

The foregoing has outlined rather broadly the features and technical advantages of the present invention in order that the detailed description of the invention that follows may be better understood. Additional features and advantages of the invention will be described hereinafter which form the subject of the claims of the invention.

DETAILED DESCRIPTION

The present invention provides circuits and systems for producing a static switching factor on the output lines of dynamic logic devices. In this way, an output logic state is maintained so long as the value of the Boolean operation being performed by the device does not change. Additionally, static logic elements may perform the inversions necessary to output both logic senses, mitigating the need to provide for dual rail dynamic logic implementations. An asymmetric clock may also be employed, permitting a concomitant decrease in the size of the precharge transistors, thus ameliorating the area required by the logic device.

In the following description, numerous specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein depicted elements are not necessarily shown to scale and wherein like or similar elements are designated by the same reference numeral by the several views.

Referring now to FIG. 2.1, there is illustrated therein logic device 200 in accordance with the present inventive principles. In general, logic device 200 receives a plurality, n, of inputs 202a–202d provided to logic tree 204, and outputs a Boolean combination of the inputs. The particular Boolean function performed by logic device 200 is reflected in the implementation of logic tree 204 (accounting for the inversion performed by the inverter formed by NFET 206 and PFET 208). Logic tree 204 is coupled between the drain of PFET 212 and the drain of NFET 214, node 216. The node formed by the junction of the logic tree and the drain of PFET 212 forms dynamic node 210.

For example, refer now to FIG. 2.2.1, illustrating logic tree 230 including three parallel connected NFETs, 231, 233 and 235. Logic tree 230 may be used to provide a logic device generating the logical NOR of the three input signals coupled to corresponding ones of the gates of NFETs 231, 233 and 235, a, b and c (as indicated by the Boolean expression in FIG. 2.3.1) and accounting for the inversion via NFET 206 and PFET 208. Similarly, referring to FIG. 2.2.2 illustrating a logic tree 232 including three serially connected NFETs 237, 239 and 241. Logic tree 232 may be used in conjunction with the logic device 200 to generate the logical NAND of the three input signals (as indicated by the Boolean expression in FIG. 2.2.2).

Returning to FIG. 2.2.1, dynamic node 210 is coupled to the common junction of the gates of NFET 206 and PFET 208 which invert the signal on dynamic node 210. The inverted signal is provided on out 218a. The transistor pair, 206 and 208, is serially coupled to parallel NFETs 220 and 222. NFET 220 is switched by clock 224. Thus, during the evaluate phase of clock 224, the inverter pair, NFET 206 and NFET 208 are coupled between the supply rails by the action of NFET 220.

The operation of logic 200 during the evaluate phase, $\phi_1$, may be further understood by referring to FIG. 2.3 illustrating an exemplary timing diagram corresponding to the dynamic logic circuit of FIG. 2.1 in combination with a logic tree embodiment 230 of FIG. 2.2.1. In this way, for purposes of illustration, the timing diagram in FIG. 2.3 is the counterpart to the timing diagram in FIG. 1.2 for the three-input OR gate 100 depicted in FIG. 1.1. As shown, input a is "high" or "true" between $t_1$ and $t_2$. In the evaluate phase, $\phi_1$ of clock 224, dynamic node 210 is pulled down (intervals $I_1$). In these intervals, out 218a is held high by the action of the inverter formed by transistors 206 and 208, which inverter is active through the action of NFET 220 as previously described. In the intervening intervals, $I_2$, dynamic node 210 is pulled up via the action of the precharge phase, $\phi_2$ of clock 224, and PFET 212. In these intervals, the inverter is inactive as NFET 220 is off. Out 218a is held "high" by the action of inverter 226 and PFET 228. Note also that the output of inverter 226 may provide a complementary output, out 218b. (Thus, with respect to the three-input logic trees in FIGS. 2.2.1 and 2.2.2, the corresponding logic device represents a three-input OR gate and a three-input AND gate, respectively.)

Returning to FIG. 2.1, if the logic tree evaluates "high", that is the Boolean combination of inputs 202a–202d represented by logic tree 204, evaluate high, whereby dynamic node 210 maintains its precharge, out 218a is discharged via NFET 206 and NFET 220. In the subsequent precharge phase, $\phi_2$, of clock 224, out 218a is latched via the action of inverter 226 and NFET 222. Thus, referring again to FIG. 2.3, corresponding to the three input OR embodiment of logic device 200 and logic tree 230 (FIG. 2.2.1) at $t_2$ input a falls, and in the succeeding evaluate phase of clock 224, dynamic node 210 is held high by the precharge. The inverter pair, NFETs 206 and 208, are active in the evaluate phase of $\phi_1$, of clock 224 because of the action of NFET 220. Consequently, out 218a falls ($t_3$) In the succeeding precharge phase, $\phi_2$ of clock 224, out 218a is latched in the "low" state, as previously described.

In this way, logic 200, FIG. 2.1 may provide a static switching factor on out 218a, and likewise with respect to the complementary output out 218b. It would also be recognized by artisans of ordinary skill that although logic device 200, FIG. 2.1, has been described in conjunction with the particular logic tree embodiments of FIG. 2.2.1 and FIG. 2.2.2, that the principles of the present invention apply to alternative embodiments having other logic tree implementations, and such alternative embodiments fall within the spirit and the scope of the present invention.

Note too, as illustrated in the exemplary timing diagram in FIG. 2.3, the duty factor of the clock may have a value that is less than fifty percent (50%). In such an embodiment, the evaluate phase, $\phi_1$ of the clock may be shorter in duration than the pre-charge phase, $\phi_2$. (A clock having a duty factor less than fifty percent may be referred to as a pulse (or pulsed) clock.) Note that a width of the evaluate phase may be sufficiently short that leakage from the dynamic node may be inconsequential. That is, leakage does not affect the evaluation of the node.

In such a clock embodiment, the size of the precharge device (PFET 212 in the embodiment of FIG. 2.1) may be reduced. It would be recognized by those of ordinary skill in the art that a symmetric clock has a fifty percent (50%) duty cycle; in an embodiment in which the duty cycle of the clock is less than fifty percent, the size of the precharge device may be reduced concomitantly. In particular, an embodiment of the present invention may be implemented with a clock duty cycle of approximately thirty percent (30%). Additionally, while logic device 200 has been described from the perspective of "positive" logic, alternative embodiments in accordance with the present inventive principles may be implemented in the context of "negative" logic and such embodiments would also fall within the spirit and scope of the present invention.

Referring now to FIG. 3.1, there is illustrated therein a portion 300 of a data processing system incorporating limited switch dynamic logic (LSDL) in accordance with the present inventive principles. System portion 300 may be implemented using a two-phase clock (denoted clock 1 and clock 2). A timing diagram which may be associated with system portion 300 will be discussed in conjunction with FIG. 3.2. LSDL logic blocks 302b that may be clocked by a second clock phase, clock 2, alternates with logic block 302a clocked by the first clock phase, clock 1. Additionally, system portion 300 may include static logic elements 304 between LSDL blocks. Typically, static blocks 304 may include gain stages, inverters or logic gates. However, alternative embodiments may include any amounts of static logic. Additionally, as previously mentioned, an embodiment of system portion 300 may be implemented without static logic elements 304.

FIG. 3.2 illustrates a timing diagram which may correspond to logic system employing a two-phase, pulsed clock, such as system portion 300, FIG. 3.1, in accordance with the present inventive principles. The LSDL evaluate during the LSDL evaluate, or drive, portion 306 of their respective clocks. As previously described, the duty factor of each of clock 1 and clock 2 may be less than fifty percent (50%). The width of the LSDL drive portions 306 of the clocks need only be sufficiently wide to allow the evaluate node (such as dynamic node 210, FIG. 2.1) to be discharged through the logic tree (for example logic tree 204, FIG. 2.1). As previously described, the duration of the drive portion may be sufficiently narrow that leakage from the evaluation may be in consequential. Consequently, LSDL are not particularly sensitive to the falling edge of the clocks, and in FIG. 3.2, the falling portion of the evaluate phase 306 of the clocks has been depicted with cross-hatching. As noted hereinabove, the duty factor of clock 1 and clock 2 may be approximately thirty percent (30%) in an exemplary embodiment of the present invention. (It would be appreciated, however, that the present inventive principles may be incorporated in alternative embodiments which have other duty factors.) During the precharge portion 308 of the clocks, the dynamic node (for example, dynamic node 210, FIG. 2.1) is precharged, as previously discussed. Clock 2 is 180° (π radians) out of phase with clock 1. Thus, as shown, the evaluate portion 306 of clock 2 occurs during the precharge phase 308 of clock 1. Because, in the LSDL, the output states may not change during the evaluate phase of the driving clock, the inputs to LSDL blocks, for example, blocks 302b, FIG. 3.1, are stable during the evaluate phase of the corresponding driving clock, clock 2. The time interval, between the end of the evaluate portion 306 of clock 1 and the rising edge of clock 2 may be established by the setup time of the LSDL, and the evaluation time of the static blocks, if any (for example, static blocks 304, FIG. 3.1). The time, τ, together with duty factor may determine the minimum clock period for a particular LSDL implementation. Thus, a system portion 300, FIG. 3.1 having a two-phase clock effects two dynamic evaluations per period, T, of the driving clocks. It would be further appreciated by those of ordinary skill in the art that, in general, the present inventive principles may be incorporated in alternative embodiments of a LSDL logic system having a plurality, n, clock phases. Such alternative embodiments would fall within the spirit and scope of the present invention.

An LSDL logic system in accordance with the principles of the present invention, such as system 300, FIG. 3.1, may be used, in an exemplary embodiment, in an arithmetic logic unit (ALU). A typical ALU architecture requires a significant number of exclusive-OR (XOR) operations. The XOR of two Boolean values requires having both senses of each of the Boolean values, that is, both the value and it's complement ($a \oplus b = ab' + a'b$). As previously described, use of dual rail dynamic logic to implement such functionality obviates the advantages in area and power otherwise obtained by dynamic logic. A data processing system including an ALU embodying the present inventive principles is illustrated in FIG. 4.

FIG. 4 is a high level functional block diagram of selected operational blocks that may be included in a central processing unit (CPU) 400. In the illustrated embodiment, CPU 400 includes internal instruction cache (I-cache) 440 and data cache (D-cache) 442 which are accessible to memory (not shown in FIG. 4) through bus 412, bus interface unit 444, memory subsystem 438, load/store unit 446 and corresponding memory management units: data MMU 450 and instruction MMU 452. In the depicted architecture, CPU 400 operates on data in response to instructions retrieved from I-cache 440 through instruction dispatch unit 448. Dispatch unit 448 may be included in instruction unit 454 which may also incorporate fetcher 456 and branch processing unit 458 which controls instruction branching. An instruction queue 460 may interface fetcher 456 and dispatch unit 448. In response to dispatched instructions, data retrieved from D-cache 442 by load/store unit 446 can be operated upon by one of fixed point unit (FXU) 460, FXU 462 or floating point execution unit (FPU) 464. Additionally, CPU 400 provides for parallel processing of multiple data items via vector execution unit (VXU) 466. VXU 466 includes vector permute unit 468 which performs permutation operations on vector operands, and vector arithmetic logic unit (VALU) 470 which performs vector arithmetic operations, which may include both fixed-point and floating-point operations on vector operands. VALU 470 may be implemented using LSDL in accordance with the present inventive principles, and in particular may incorporate LSD logic systems, of which LSD system 300, FIG. 3.1 is exemplary.

Figure 5:
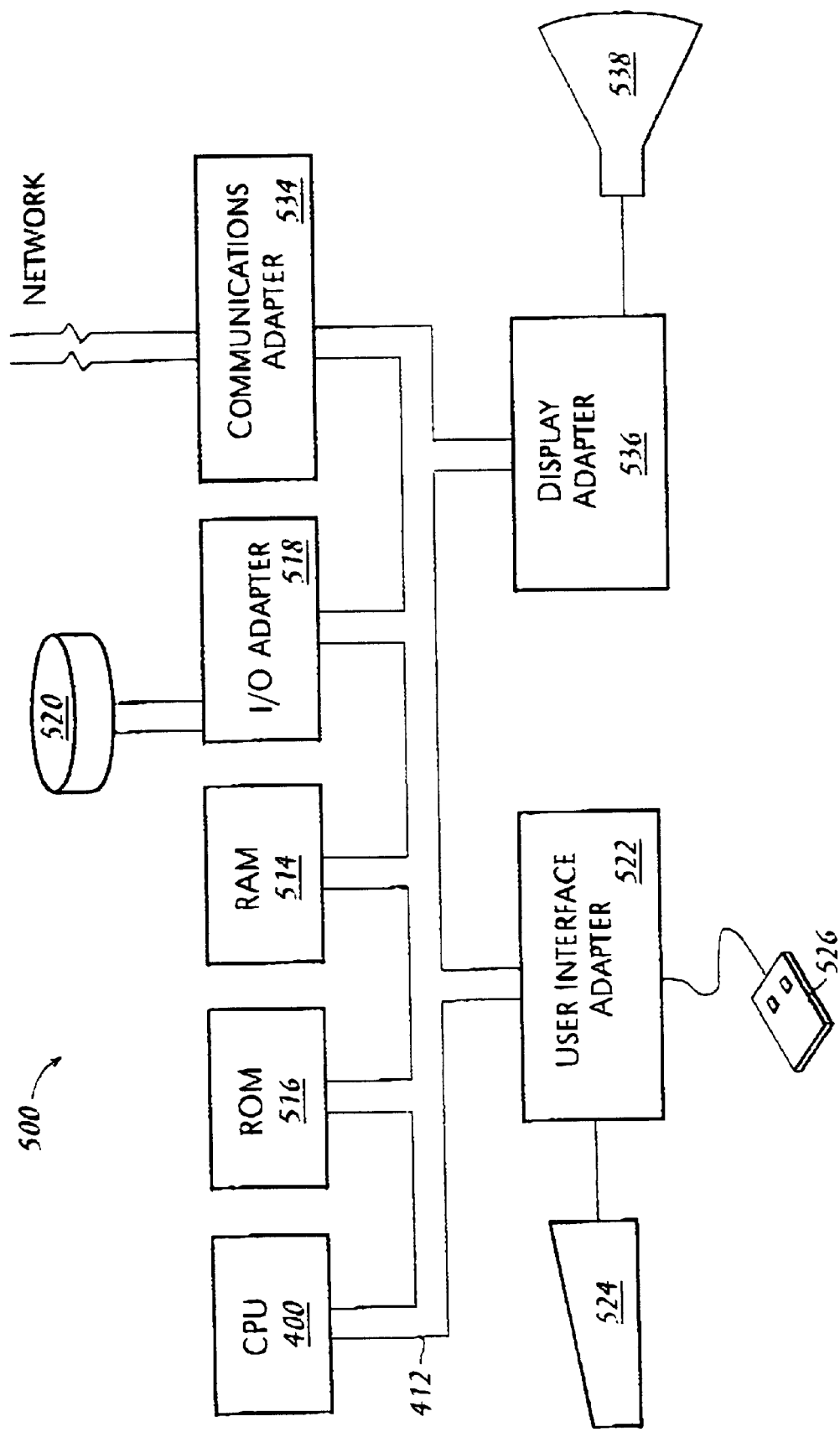
FIG. 5 illustrates a data processing system configured in accordance with the present invention.

A representative hardware environment 500 for practicing the present invention is depicted in FIG. 5, which illustrates a typical hardware configuration of a data processing system in accordance with the subject invention having CPU 400, incorporating the present inventive principles, and a number of other units interconnected via system bus 412. The data processing system shown in FIG. 5 includes random access memory (RAM) 514, read only memory (ROM) 516, and input/output (I/O) adapter 518 for connecting peripheral devices such as disk units 520 to bus 412, user interface adapter 522 for connecting keyboard 524, mouse 526, and/or other user interface devices such as a touch screen device (not shown) to bus 412, communication adapter 534 for connecting the system to a data processing network, and display adapter 536 for connecting bus 412 to display device 538. Note that CPU 400 may reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. A logic device comprising:
    a dynamic logic portion for evaluating a Boolean function of a plurality of input signals, wherein a signal on a first node asserted in response to a first phase of a clock comprises a first Boolean combination of the plurality of input signals; and
    a static portion coupled to the first node, wherein the static portion is configured to maintain a first output value of the logic device during a second phase of the clock, and wherein the first output value comprises the Boolean function, and wherein a duration of the first phase of the clock is materially less than a duration of the second phase of the clock, and wherein the duration of the first phase is selected such that a an uncompensated leakage from the first node does not affect an evaluation of the first node.

2. The logic device of claim 1 further comprises a second node for outputting the first output value, and a third node for outputting a second output value comprising a complement of the first output value.

3. The logic device of claim 1 wherein is a size of a precharge device coupled to the first node is selected corresponding to the duration of the second phase of the clock.

4. A logic device comprising:
   a dynamic logic portion for evaluating a Boolean function of a plurality of input signals, wherein a signal on a first node asserted in response to a first phase of a clock comprises a fist Boolean combination of the plurality of input signals; and
   a static portion coupled to the first node, wherein the static portion is configured to maintain a first output value of the logic device during a second phase of the clock, and wherein the first output value comprises the Boolean function and wherein a duration of the first phase of the clock is less than a duration of the second phase of the clock, and wherein the duration of the first phase is selected such that a leakage from the first node does not affect an evaluation of the first node, wherein the static portion includes:
      serially coupled complementary field effect transistors having a common node comprising a first output node of the logic device and parallel coupled gates further coupled to the first node; and
      a first field effect transistor serially coupled between the complementary field effect transistors and a first supply voltage, the first field effect transistor having a gate for receiving a signal having a value comprising a complement of the first output value.

5. The logic device of claim 4 further including an inverter coupled to the first output node, an output of the inverter comprising a second output node of the device, and wherein the gate of the first field effect transistor is coupled to the output of the inverter.

6. The logic device of claim 5 further comprising a second field effect transistor coupled in parallel with a first one of the serially coupled complementary field effect transistors, a gate of the second field effect transistor being coupled to the output node of the inverter, and wherein a common node of the second field effect transistor and the first one of one of the serially coupled complementary field effect transistors is coupled to a second supply voltage.

7. The logic device of claim 4 wherein the dynamic portion includes a second field effect transistor coupled in parallel with the first field effect transistor, the second field effect transistor having a gate coupled to the clock.

8. The logic device of claim 4 wherein the dynamic portion further comprises a logic tree serially coupled between the first node and a second field effect transistor, the second field effect transistor having a source coupled to a second supply voltage and a gate coupled to the clock.

9. A logic system comprising:
   a first logic device wherein the first logic device includes,
      a first dynamic logic portion for evaluating a first Boolean function of a first plurality of input signals, wherein a signal on a first node of the first logic device asserted in response to a first phase of a first clock includes a first Boolean combination of the first plurality of input signals; and wherein the first logic device further includes a first static portion coupled to the first node of the first logic device, wherein the first static portion is configured to maintain a first output value of the first logic device during a second phase of the first clock, and wherein the first output value comprises the first Boolean function; and
   a second logic device wherein the second logic device includes a second dynamic logic portion for evaluating a second Boolean finction of a second plurality of input signals, wherein a signal on a first node of the second logic device asserted in response to a first phase of a second clock includes a second Boolean combination of the second plurality of input signals, and wherein one of the second plurality of input signals is derived from an output signal of the first logic device; and wherein the second logic device further includes a second static portion coupled to the first node of the second logic device, wherein the second static portion is configured to maintain a first output value of the logic device during a second phase of the second clock, wherein the second output value comprises the second Boolean finction, and wherein each of the first and second phases of the second clock has a predetermined phase shift relative to a respective one of the first and second phases of the first clock, and wherein a respective duration of the first phase of the first and second clocks is less than a respective duration of the second phase of the first and second clocks.

10. The logic system of claim 9 wherein the predetermined phase shift is $\pi$ radians.

11. The logic system of claim 10 wherein the first static portion includes:
   first serially coupled complementary field effect transistors having a common node comprising a first output node of the first logic device and parallel coupled gates further coupled to the first node of the first logic device; and
   a first field effect transistor serially coupled between the first serially coupled complementary field effect transistors and a first supply voltage, the first field effect transistor having a gate for receiving a signal having a value comprising a complement of the first output value of the first logic device; and wherein the second static portion includes:
   second serially coupled complementary field effect transistors having a common node comprising a first output node of the second logic device and parallel coupled gates further coupled to the first node of the second logic device; and
   a second field effect transistor serially coupled between the second serially coupled complementary field effect transistors and the first supply voltage, the second field effect transistor having a gate for receiving a signal having a value comprising a complement of the first output value of the second logic device.

12. The logic system of claim 10 wherein the first logic device further includes a first inverter coupled to a first output node of the first logic device, an output of the first inverter comprising a second output node of the first logic device, and wherein the second logic device includes a second inverter coupled to a first output node of the second logic device, an output of the second inverter comprising a second output node of the second logic device.

13. The logic system of claim 12 wherein a gate of the first field effect transistor is coupled to the output of the first inverter and a gate of the second field effect transistor is coupled to the output of the second inverter, the first logic device further including:

a third field effect transistor coupled in parallel with a first one of the first complementary field effect transistor pair, a gate of the third field effect transistor being coupled to the output node of the first inverter, and wherein a common node of the third field effect transistor and the first one of one of the first complementary field effect transistor pair is coupled to a second supply voltage, and the second logic device further including:

a fourth field effect transistor coupled in parallel with a first one of the second complementary field effect Transistor pair, a gate of the fourth field effect transistor being coupled to the output node of the second inverter, and wherein a common node of the fourth field effect transistor and the first one of one of the second complementary field effect transistor pair is coupled to the second supply voltage.

14. The logic system of claim 13 wherein the first dynamic logic portion includes a fifth field effect transistor coupled in parallel with the first field effect transistor, the fifth field effect transistor having a gate coupled to the clock, and wherein the second dynamic logic portion includes a sixth field effect transistor coupled in parallel with the second field effect transistor, the sixth field effect transistor having a gate coupled to the clock.

15. The logic system of claim 9 wherein the duration of the first phase of each of the first and second clocks is selected such that a leakage from the first node of the first logic device and the first node of the second logic device, respectively, does not affect an evaluation of the first nodes.

16. The logic system of claim 9 wherein a size of a precharge device coupled to the first node of the first logic device and a size of a precharge device coupled to the first node of the second logic device are selected corresponding of the duration of the second phase of the first clock and the duration of the second phase of the second clock, respectively.

17. A data processing system comprising:

a central processing unit (CPU);

a memory operable for communicating instructions and operand data to said CPU, wherein the CPU includes a logic system including a first logic device having a first dynamic logic portion for evaluating a first Boolean function of a first plurality of input signals, a signal on a first node of the first logic device asserted in response to a first phase of a first clock forming a first Boolean combination of the first plurality of input signals and wherein the first logic device further includes a first static portion coupled to the first node, wherein the first static portion is configured to maintain a first output value of the first logic device during a second phase of the first clock, wherein the first output value comprises the first Boolean function, wherein a duration of the first phase of the fist clock is less than a duration of the second phase of the first clock, and a second logic device wherein the second logic device includes a second dynamic logic portion for evaluating a second Boolean function of a second plurality of input signals, a signal on a first node of the second logic device asserted in response to a first phase of a second clock forming a Boolean combination of the second plurality of input signals, and wherein one of the second plurality of input signals is derived from an output signal of the first logic device, and a second static portion coupled to the first node of the second logic device, wherein the second static portion is configured to maintain a first output value of the second logic device during a second phase of the second clock, wherein the first output value of the second logic device comprises the second Boolean function, and wherein a duration of the first phase of the second clock is less than a duration of the second phase of the second clock, and wherein each of the first and second phases of the second clock has a predetermined phrase shift relative to a respective one of the first and second phases of the first clock.

18. The data processing system of claim 17 further comprising a third logic device wherein the third logic device includes a third dynamic logic portion for evaluating a third Boolean finction of a third plurality of input signals, a signal on a first node of the third logic device asserted in response to a first phase of a third clock forming a second Boolean combination of the third plurality of input signals, and a third static portion coupled to the first node of the third logic device, wherein the third static portion is configured to maintain a third output value of the third logic device during a second phase of the third clock, wherein the third output value comprises the third Boolean function, and wherein a duration of the first phase of the third clock is less than a duration of the second phase of the third clock.

19. The data processing system claim 17 wherein the CPU further comprises an arithmetic logic unit, and wherein the arithmetic logic unit comprises the logic system.

20. The data processing system of claim 17 wherein the first static portion comprises:

first serially coupled complementary field effect transistors having a common node comprising a first output node of the first logic device and parallel coupled gates further couple to the first node of the first logic device; and a first field effect transistor serially coupled between the first serially coupled complementary field effect transistors and a first supply voltage, the first field effect transistor having a gate for receiving a signal having a value comprising a complement of the first output value of the first logic device.

21. The data processing system of claim 20 wherein the arithmetic logic unit further comprises a fourth logic device selected from the group consisting of a static inverter, a gain stage and a static logic gate, the fourth logic device disposed between the second and third logic devices, an output of the fourth logic device comprising on of the third plurality of input signals of the third logic device.

22. The data processing system of claim 20 wherein the second static portion comprises:

second serially coupled complementary field effect transistors having a common node comprising a first output node of the second logic device and parallel coupled gates further coupled to the first node of the second logic device; and a second field effect transistor serially coupled between the second serially coupled complementary field effect transistors and a first supply voltage, the second field effect transistor having a ate for receiving a signal having a value comprising a complement of the first output value of the second logic device; and wherein the third static portion includes a third serially coupled complementary field effect transistors having a common node comprising a first output node of the third logic device and parallel coupled gates further coupled to the first node of the third logic device, and a third field effect transistor serially coupled between the third serially coupled complementary field effect transistors and the first supply voltage, the third field effect transistor having a gate for receiving a signal having a value comprising a complement of the first output value of the third logic device.

23. The data processing system of claim 17 wherein the duration of the first phase of the first clock is selected such that a leakage from the first node of the logic device does not affect an evaluation of the first node of the first logic device.

24. The data processing system of claim 17 wherein a size of a precharge device coupled to the first node of the first logic device is selected corresponding to the duration of the second phase of the first clock.

* * * * *

UNITED STATES PATENT AND TRADEMARK OFFICE
CERTIFICATE OF CORRECTION

PATENT NO.    : 6,650,145 B2                                                                Page 1 of 1
DATED         : November 18, 2003
INVENTOR(S)   : Hung Cai Ngo, Wendy Ann Belluomini and Robert Kevin Montoye It is certified that error appears in the above-identified patent and that said Letters Patent is hereby corrected as shown below:

Column 7,
Line 5, following "that" please delete "a".
Line 25, following "function" please insert -- , --.

Column 9,
Line 14, please replace "Transistor" with -- transistor --.
Line 56, please replace "fist" with -- first --.

Column 10,
Line 34, please replace "couple" with -- coupled --.
Line 59, please replace "ate" with -- gate --.

Signed and Sealed this

First Day of June, 2004

JON W. DUDAS
*Acting Director of the United States Patent and Trademark Office*